United States Patent [19]

Koden

[11] Patent Number: 4,862,234
[45] Date of Patent: Aug. 29, 1989

[54] THIN-FILM TRANSISTOR
[75] Inventor: Mitsuhiro Koden, Nara-shi, Japan
[73] Assignee: Sharp Kabushiki Kaisha, Osaka, Japan
[21] Appl. No.: 125,961
[22] Filed: Nov. 27, 1987
[30] Foreign Application Priority Data Nov. 29, 1986 [JP] Japan ................................ 61-284950
Dec. 5, 1986 [JP] Japan ................................ 61-291222

[51] Int. Cl.⁴ .......................................... H01L 29/78
[52] U.S. Cl. ...................................... 357/23.7; 357/4; 357/2
[58] Field of Search ................................ 357/23.7, 4, 2

[56] References Cited
U.S. PATENT DOCUMENTS

| | | | |
|---|---|---|---|
| 4,425,572 | 1/1984 | Takafuji | 357/23.7 X |
| 4,609,930 | 9/1986 | Yamazaki | 357/23.7 |
| 4,746,628 | 5/1988 | Takafuji | 357/2 X |
| 4,752,814 | 6/1988 | Tuan | 357/2 X |
| 4,757,361 | 7/1988 | Brodsky | 357/2 X |

Primary Examiner—Martin H. Edlow
Attorney, Agent, or Firm—Irell & Manella

[57] ABSTRACT

A thin-film transistor comprising an insulating substrate; an opaque metal gate electrode disposed on a portion of said insulating substrate; a gate insulating layer disposed on said insulating substrate including said gate electrode; and a-Si semiconductor film disposed on the portion of said gate insulating layer, said a-Si semiconductor film having been formed to attain self-alignment with respect to said gate electrode; a-Si contact films constituting source and drain regions, respectively, with a gap therebetween disposed on said a-Si semiconductor film, the outer end of each of said contact films being formed to attain self-alignment with respect to said gate electrode; source and drain electrodes, respectively, disposed on said source and drain regions, the thickness of each of said a-Si semiconductor film and said a-Si contact film being 100 Å or more and the total amount of thicknesses thereof being 1,000 Å or less.

3 Claims, 6 Drawing Sheets

THIN-FILM TRANSISTOR

BACKGROUND OF THE INVENTION

1. Field of the Invention

This invention relates to a thin-film transistor that uses a semiconductor film of amorphous silicon (a-Si). More particularly, it relates to a technology for the prevention of a decrease in the off-resistance of a thin-film transistor due to light from a back light positioned at the back of the thin-film transistor in the case where the thin-film transistor is used as a display device provided with liquid crystal panels.

2. Description of the Prior rt

In recent years, there has been a good potential market for the active-matrix display devices, as large-scale display devices that use liquid crystals, etc., in which thin-film transistors made with the use of a semiconductor film of a-Si are formed in a matrix on an insulating substrate such as glass, etc.

FIG. 16 shows a conventional thin-film transistor Tr using a semicondctor film of a-Si wherein an active layer 4a disposed on a gate insulating film 3a is much broader than a gate electrode 2a positioned below the gate insulating film 3a, and moreover either the active layer 4a or an n+-a-Si semiconductor film forming both source and drain regions 6a and 7a is made without consideration of its thickness. A protective insulating film 5a is disposed on the active layer 4a.

In the case where the thin-film transistor Tr constitutes a display device with liquid crystals, a back light is placed at the insulating substrate (glass plate 1a) side. When the thin-film transistor Tr is off (i.e., negative voltage is applied to the gate electrode 2a), carriers, (such as electrons and their related holes) are generated due to light from the back light, in the portion of the active layer 4a that is not in alignment with the gate electrode 2a, resulting in a decrease in the resistance of the thin-film transistor Tr at the time when the thin-film transistor Tr is off. Thus, the thin-film transistor Tr does not function as a switching device.

In order to solve this problem, the thickness of the active layer 4a of an a-Si semiconductor film can be thinned. For example, when the thickness thereof is set to be 100 Å or less, the influence of the back light on the active layer 4a is not observed. However, if the active layer 4a is made too thin, then the resistance of the thin-film transistor Tr becomes unacceptably high when the transistor Tr is turned on.

The generation of carriers in the active layer 4a can be also prevented by the formation of an optical shield in the thin-film transistor Tr, which causes an increase in the number of production steps, making yields low and increasing the production cost.

Moreover, the thin-film transistor Tr can be designed such that the active layer 4a is positioned at a portion of the gate insulating layer 3a corresponding to the gate electrode 2a and is formed into the same shape and size as the gate electrode 2a by a common mask-alignment technique. However, according to such a technique, alignment errors arise unavoidably and side-etchings must be carried out, which makes the size of the thin-film transistor large, resulting in a decrease in the ratio of the surface area of the picture-element electrode to the surface area of the liquid-crystal display panel and an increase in the load capacity between the gate electrode and the drain electrode. Accordingly, the enlargement of the surface area of the display device cannot be attained.

SUMMARY OF THE INVENTION

The thin-film transistor of this invention, which overcomes the above-discussed and numerous other disadvantages and deficiencies of the prior art, comprises a thin-film transistor comprising an insulating substrate; an opaque metal gate electrode disposed on a portion of said insulating substrate; a gate insulating layer disposed on said insulating substrate including said gate electrode; an a-Si semiconductor film disposed on the portion of said gate insulating layer, said a-Si semiconductor film having been formed to attain self-alignment with respect to said gate electrode; a-Si contact film constituting source and drain regions, respectively, with a gap therebetween disposed on said a-Si semiconductor film, the outer end of each of said contact films being formed to attain self-alignment with respect to said gate electrode; source and drain electrodes, respectively, disposed on said source and drain regions, the thickness of each of said a-Si semiconductor film and said a-Si contact film being 100 Å or more and the total amount of thicknesses thereof being 1,000 Å or less.

In a preferred embodiment, a protective insulating film is positioned between the a-Si semiconductor film and each of the a-Si contact films. Alternatively, each of the a-Si contact films is directly positioned on said a-Si semiconductor film.

Thus, the invention described herein makes possible the objectives of (1) providing a thin-film transistor that prevents the generation of carriers in the active layer even when negative voltage is applied to the gate electrode (i.e., the thin-film transistor is off), thereby maintaining the off-resistance at a fixed level, and moreover that maintains the on-resistance at a low level when the thin-film transistor is on; (2) providing a thin-film transistor that is simply produced at a low cost; and (3) providing a miniaturized thin-film transistor that attains the enlargement of the surface area of a display device using the thin-film transistor.

BRIEF DESCRIPTION OF THE DRAWINGS

This invention may be better understood and its numerous objects and advantages will become apparent to those skilled in the art by reference to the accompanying drawings as follows.

DESCRIPTION OF PREFERRED EMBODIMENTS

This invention provides a thin-film transistor that comprises an active layer and source and drain regions, which are formed in a manner to attain self-alignment with respect to a gate electrode made of opaque metals.

EXAMPLE 1

Figure 1:
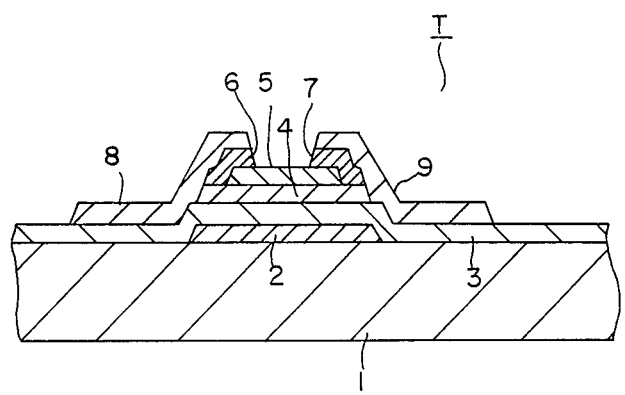
FIG. 1 is a side sectional view showing a thin-film transistor of this invention.

FIG. 1 shows a thin-film transistor of this invention, which comprises an insulating substrate 1 made of a glass plate having a thickness of about 1 mm, a gate electrode 2 of opaque metals such as Ta, Cr, Mo, Al or W, a gate insulating layer 3, an active layer 4 made of an a-Si film, a protective insulating film 5, source and drain regions 6 and 7 made of a phosphorus-doped n+-a-Si film that attains an ohmic contact with source and drain electrode 8 and 9 made of a metal film.

Figure 2:
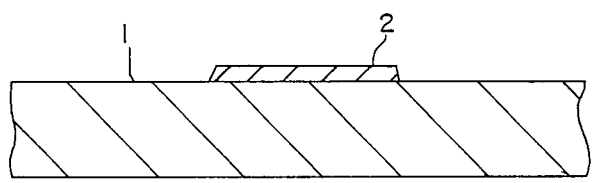
FIGS. 2 to 7 are diagrams showing a production process of the thin-film transistor shown in FIG. 1.
Figure 3:
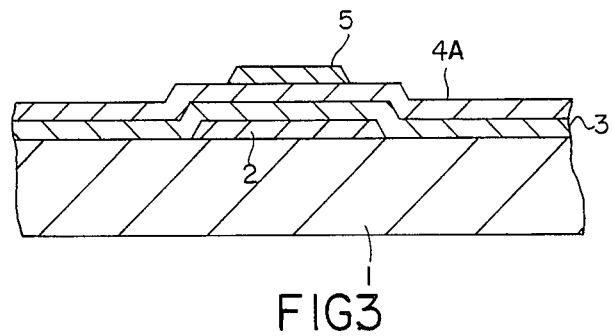
Figure 4:
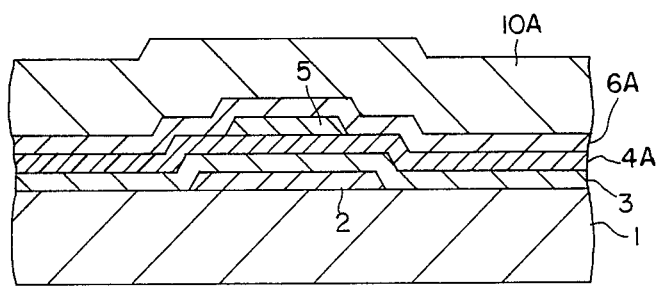

This thin-film transistor is produced as follows:

On the insulating substrate 1 of a glass plate, the gate electrode 2 with a desired pattern made of metals such as Ta, etc., is disposed as shown in FIG. 2. Then, as shown in FIG. 3, on the entire surface of the insulating substrate 1 including the gate electrode 2, the gate insulating layer 3 and the a-Si semiconductor layer 4A having a thickness of 200 Å are successively disposed by plasma assisted chemical vapor deposition. Then, the protective insulating film 5 that has a width smaller than that of the gate electrode 2 is disposed on the portion of the said a-Si semiconductor layer 4A corresponding to the gate electrode 2. Then, as shown in FIG. 4, on the a-Si semiconductor layer 4A including the protective insulating film 5, the phosphorus-doped n+-a-Si layer 6A having a thickness of 2,000 Å and a positive photoresist layer 10A are successively disposed.

Figure 5:
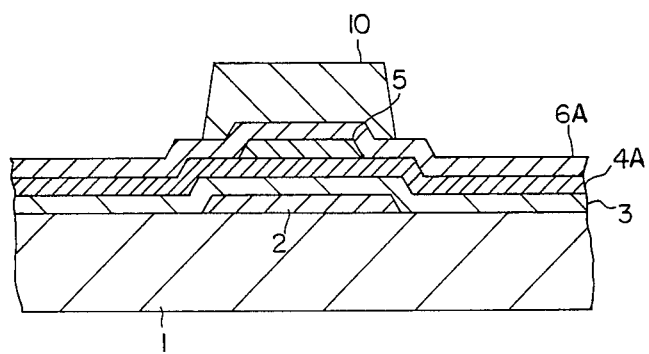

Thereafter, the wafer is exposed to light from the back face of the insulating substrate 1. The gate electrode 2 that is opaque functions as a photomask, and the portions of the positive photoresist layer 10A except for the portion of the positive photoresist layer 10A corresponding to the gate electrode 2 are removed, as shown in FIG. 5, resulting in a resist 10 that is in alignment with the gate electrode 2. When the total amount of thicknesses of the n+-a-Si layer 6A and the a-Si semiconductor layer 4A is 1,000 Å or less, light effectively passes through the positive photoresist layer 10A.

Figure 6:
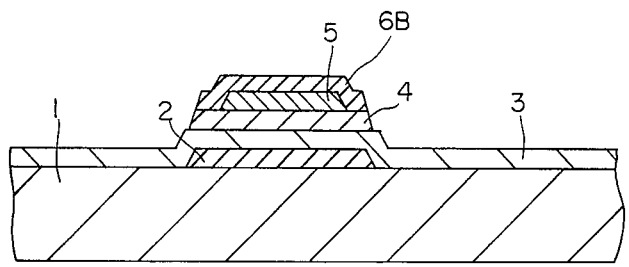
Figure 7:
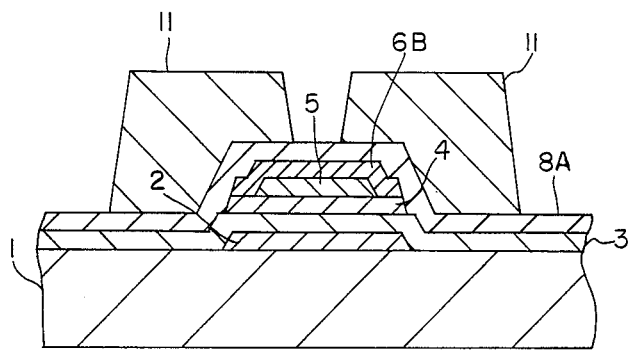

Then, the n+-a-Si layer 6A and the a-Si semiconductor layer 4A are etched with the use of the resist 10 as a mask, as shown in FIG. 6, resulting in an n+-a-Si layer 6B and the active layer 4 that are in alignment with the gate electrode 2. The resist 10 is then removed. As shown in FIG. 7, on the entire surface of the wafer at the n+-a-Si layer side, a metal layer 8A is then disposed and photoresissst 11 are disposed on the metal layer 8A except for the portion of the metal layer 8A corresponding to the center area of the n+-a-Si layer 6B. Then, the metal layer 8A and the n+-a-Si layer 6B are etched with the use of the photoresists 11 as a mask, as shown in FIG. 1, resulting in the source and drain regions 6 and 7 and the source and drain electrodes 8 and 9. The photoresists 11 are then removed, resulting in a desired thin-film transistor of this invention.

The protective insulating film 5 functions to prevent the occurrence of interface charges at the interface between the active layer 4 and the protective insulating film 5, thereby attaining an improvement of the transistor characteristics of the thin-film transistor in the off-state. Moreover, the protective insulating film 5 prevents the active layer 4 from being etched when the metal layer 8A and the n+-a-Si layer 6B are etched.

The thickness of the active layer 4 is set to be in the range of 200 to 300 Å. The width of the protective insulating layer 5 disposed on the active layer 4 is smaller than that of the gate electrode 2. The protective insulating layer 5 is made of $Si_3N_4$ or $Al_2O_3$ and has a thickness of 1,000 Å-1 μm, preferably 2,000 Å. The n+-a-Si contact film constituting the source and drain regions 6 and 7 has a thickness of 100-500 Å, preferably 200-300 Å. When the thickness of these layers and films are set to be the above-mentioned experimental values, the resistance of the thin-film transistor when the said transistor is on is maintained at a fixed level and moreover, the positive photoresist 10A is effectively exposed to light from the insulating substrate side so as to form the active layer having a desired pattern. Despite the above-mentioned experimental thickness values, in fact, when the thickness of each of the active layer 4 and the n+-a-Si film 6A is 100 Å or more and the total amount of thickness of the active layer 4 and the n+-a-Si film 6A is 1,000 Å or less, a desired thin-film transistor is obtainable.

Figure 8:
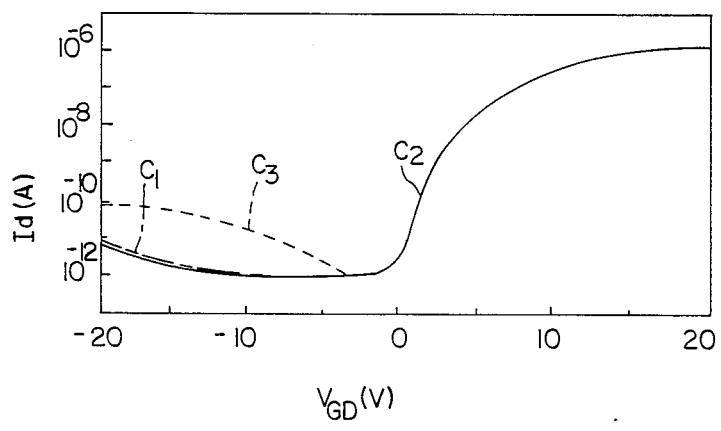
FIG. 8 is of characteristic curves showing the relationship between the gate-drain voltage $V_{GD}$ and the current Id flowing to the drain region with regard to the thin-film transistor shown in FIG. 1 of this invention and a conventional thin-film transistor.

The thin-film transistor is incorporated with liquid crystals to form a display device, wherein no carrier occurs in the active layer 4 even when the thin-film transistor is irradiated with light from the insulating substrate side, and accordingly the resistance of the thin-film transistor in the off-state does not decrease. This is indicated by the following experiments: A display device, which was constructed by the combination of a thin-film transistor (having the active layer 4 with a thickness of 200 A and a width of 10 μm and a length of 12 μm) and liquid cyrstals, was used. When the voltage $V_{SD}$ between the source electrode and the drain electrode was 10 volts and the thin-film transistor was irradiated with light of $10^4$ luxes, the relationship between the gate-drain voltage $V_{GD}$ and the current Id flowing to the drain region 6 is indicated by the Id-$V_{GD}$ characteristic curve $C_1$ shown in FIG. 8. The Id-$V_{GD}$ characteristic curve $C_2$ indicates the relationship therebetween in the case where the thin-film transistor was not irradiated with light from the insulating substrate side. The Id-$V_{GD}$ characteristic curve $C_3$ indicates the relationship therebetween in the case where a conventional thin-film transistor was irradiated with light of $10^4$ luxes from the insulating substrate side. FIG. 8 indicates that the thin-film transistor of this example attained an improvement of the off-characteristics in the $V_{GD}$ in the range of $-20$ to $-3$ volts.

Moreover, since the thickness of the active layer 4 is over a fixed value, the resistance of the thin-film transistor of this example at the time when the transistor is on does not rise over a fixed level. The formation of the active layer 4 is carried out using the resist 10 as a mask, which has been aligned with the gate electrode 2 in cooperation with light from the insulating substrate side and the positive photoresist 10A, so that the production of the thin-film transistor can be simplified and the size thereof can be minimized.

EXAMPLE 2

Figure 9:
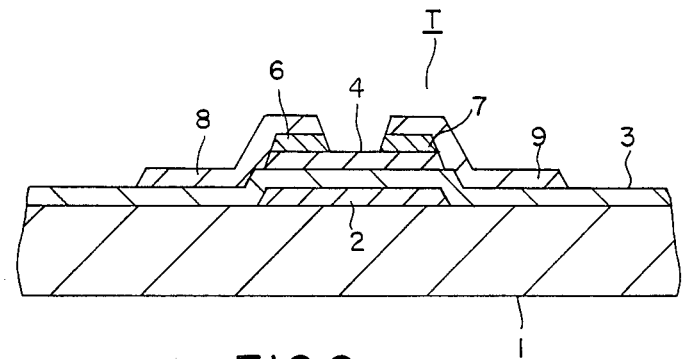
FIG. 9 is a side sectional view showing another thin-film transistor of this invention.

This example provides a thin-film transistor, as shown in FIG. 9, having the same structure as that of Example 1, except that there is no protective insulating film, wherein the source and drain regions 6 and 7 are directly disposed on the active layer 4.

Figure 10:
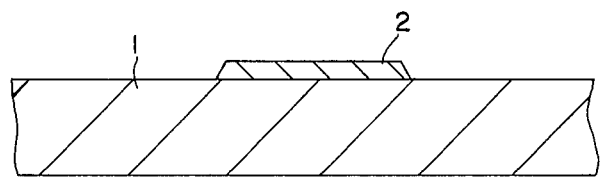
FIGS. 10 to 14 are diagrams showing a production process of the thin-film transistor shown in FIG. 9.
Figure 11:
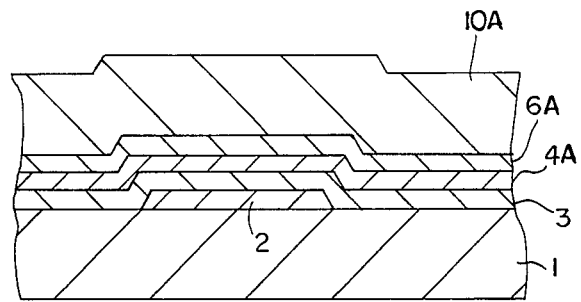
Figure 12:
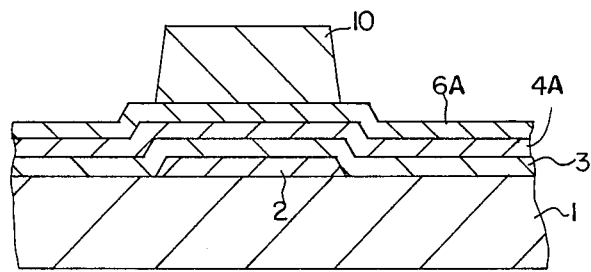
Figure 13:
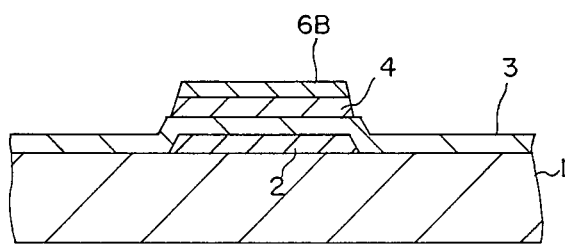
Figure 14:
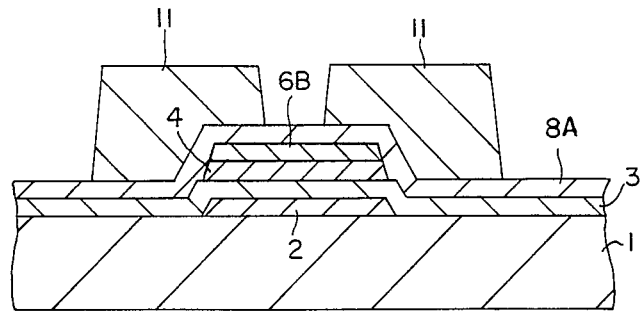

This thin-film transistor is produced as follows:

On the insulating substrate 1 of a glass plate, the gate electrode 2 with a desired pattern made of Ta is disposed as shown in FIG. 10. Then, as shown in FIG. 11, on the entire surface of the insulating substrate 1 including the gate electrode 2, the gate insulating layer 3 and the a-Si semiconductor layer 4A having a thickness of 200 Å are successively disposed by plasma assisted chemical vapor deposition. Then, the phosphorus-doped n+-a-Si layer 6A having a thickness of 200-300 Å and the positive photoresist layer 10A are successively disposed on the a-Si semiconductor layer 4A.

Thereafter, the wafer is exposed to light from the back face of the insulating substrate 1. The gate electrode 2 that is opaque functions as a photomask, and the portions of the positive photoresist layer 10A except for the portion of the positive photoresist layer 10A corresponding to the gate electrode 2 are removed, as shown in FIG. 5, resulting in a resist 10 that is in alignment with the gate electrode 2. When the total amount of thicknesses of the n+-a-Si layer 6A and the a-Si semiconductor layer 4A is 1,000 Å or less, light effectively passes through the positive photoresist layer 10A.

Then, the n+-a-Si layer 6A and the a-Si semiconductor layer 4A are etched with the use of the resist 10 as a mask, as shown in FIG. 6, resulting in an n+-a-Si layer 6B and the active layer 4 that are in alignment with the gate electrode 2. The resist 10 is then removed. As shown in FIG. 7, on the entire surface of the wafer at the n+-a-Si layer side, a metal layer 8A is then disposed and photoresists 11 are disposed on the metal layer 8A except for the portion of the metal layer 8A corresponding to the center area of the n+-a-Si layer 6B. Then, the metal layer 8A and the n+-a-Si layer 6B are etched with the use of the photoresists 11 as a mask, as shown in FIG. 1, resulting in the source and drain regions 6 and 7 and the source and drain electrodes 8 and 9. The photoresists 11 are then removed, resulting in a desired thin-film transistor of this invention.

Since the protective insulating film mentioned in Example 1 is not used here, etching of the n+-a-Si layer 6B is, of course, carried out under conditions where the active layer 4 is not etched but the n+-a-Si layer 6B is etched. This is, for example, attained by the regulation of the etching rate.

The thickness of the active layer 4 is set to be in the range of 200 to 300 Å. The n+-a-Si contact film constituting the source and drain regions 6 and 7 has a thickness of 100-500 Å, preferably 200-300 Å. When the thickness of these layers and films are set to be the above-mentioned experimental values, the resistance of the thin-film transistor when the said transistor is on is maintained at a fixed level and moreover, the positive photoresist 10A is effectively exposed to light from the insulating substrate side so as to form the active layer having a desired pattern. Despite the above-mentioned experimental thickness values, in fact, when the thickness of each of the active layer 4 and the n+-a-Si film 6A is 100 Å or more and the total amount of thickness of the active layer 4 and the n+-a-Si film 6A is 1,000 Å or less, a desired thin-film transistor is obtainable.

Figure 15:
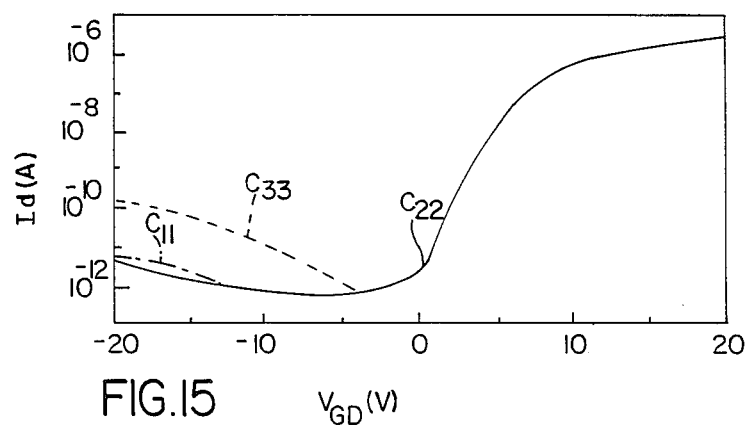
FIG. 15 is of characteristic curves showing the relationships between the gate-drain voltage $V_{GD}$ and the current Id flowing to the drain region with regard to the thin-film transistor shown in FIG. 9 of this invention and a conventional thin-film transistor.
Figure 16:
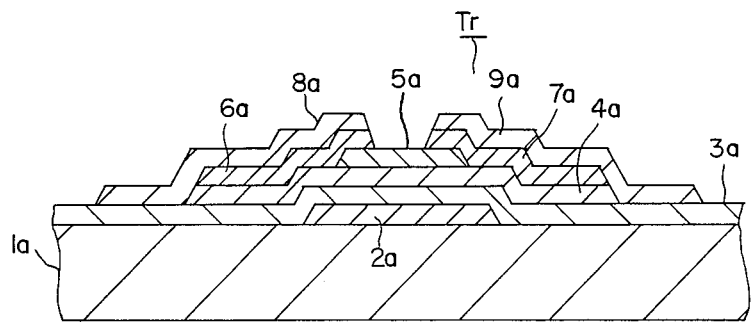
FIG. 16 is a side sectional view showing a conventional thin-film transistor.

With a display device using the above-mentioned thin-film transistor and liquid crystals, the same experiments as in Example 1 were carried out and the results are shown in FIG. 15, wherein the Id-$V_{GD}$ characteristic curves $C_{11}$ indicates the relationship between the gate-drain voltage $V_{GD}$ and the current Id flowing to the drain region 6 in the case where the thin-film transistor of this example is irradiated with light under the same conditions as in Example 1, the Id-$V_{GD}$ characteristic curve $C_{22}$ indicates the relationship therebetween in the case where the thin-film transistor of this example is not irradiated with light, and the Id-$V_{GD}$ characteristic curve $C_{33}$ is the same as the curve $C_3$ shown in FIG. 8 in Example 1. It can be seen from FIG. 15 that the thin-film transistor of this example attained an improvement of the off-characteristics in the $V_{GD}$ in the range of −20 to −3 volts.

Moreover, the thickness of the active layer 4 is likewise over a fixed value, the resistance of the thin-film transistor of this example in the on-state does not rise over a fixed level. The active layer 4 and the n+-a-Si layer constituting the source and drain regions 6 and 7 are formed by self-alignment with respect to the gate electrode 2 in cooperation with the light from the insulating substrate side and the positive photoresist 10A, and thus the production of the thin-film transistor can be simplified and the size thereof can be minimized.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A thin-film transistor comprising an insulating substrate; an opaque metal gate electrode disposed on a portion of said insulating substrate; a gate insulating layer disposed on said insulating substrate including said gate electrode; an a-Si semiconductor film disposed on the portion of said gate insulating layer, said a-Si semiconductor film having been formed to attain self-alignment with respect to said gate electrode; a-Si contact films constituting source and drain regions, respectively, with a gap therebetween disposed on said a-Si semiconductor film, the outer end of each of said contact films being formed to attain self-alignment with respect to said gate electrode; souce and drain electrodes, respectively, disposed on said source and drain regions, the thickness of each of said a-Si semiconductor film and said a-Si contact film being 100 Å or more and the total amount of thicknesses thereof being 1,000 Å or less.

2. A thin-film transistor according to claim 1, wherein a protective insulating film is positioned between the a-Si semiconductor film and each of the a-Si contact films.

3. A thin-film transistor according to claim 1, wherein each of the a-Si contact films is directly positioned on said a-Si semiconductor film.

* * * * *